US007510892B2

(12) United States Patent
Lin et al.

(10) Patent No.: US 7,510,892 B2
(45) Date of Patent: Mar. 31, 2009

(54) LIGHT EMITTING DIODE STRUCTURE AND MANUFACTURING METHOD THEREOF

(75) Inventors: Hung-Yi Lin, Tao-Yuan Hsien (TW); Hong-Da Chang, Tai-Chung Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 51 days.

(21) Appl. No.: 11/737,133

(22) Filed: Apr. 18, 2007

(65) Prior Publication Data
US 2008/0197370 A1     Aug. 21, 2008

(30) Foreign Application Priority Data
Feb. 16, 2007  (TW) ............................... 96106235 A

(51) Int. Cl.
*H01L 21/00*   (2006.01)
(52) U.S. Cl. .................. 438/29; 438/22; 257/E25.032; 257/E51.022
(58) Field of Classification Search ................. 438/637, 438/638, 22, 29; 257/E21.579, E25.032, 257/E51.022
See application file for complete search history.

(56) References Cited

U.S. PATENT DOCUMENTS

| 6,015,719 | A  | * | 1/2000  | Kish et al. ..................... 438/29 |
| 6,469,322 | B1 | * | 10/2002 | Srivastava et al. ............. 257/89 |
| 6,521,916 | B2 | * | 2/2003  | Roberts et al. ............... 257/100 |
| 7,244,924 | B2 | * | 7/2007  | Kiyomoto et al. ............ 250/216 |
| 2007/0257272 | A1 | * | 11/2007 | Hutchins ...................... 257/98 |
| 2008/0265266 | A1 | * | 10/2008 | Bogner et al. .................. 257/98 |

* cited by examiner

*Primary Examiner*—Michelle Estrada
(74) *Attorney, Agent, or Firm*—Winston Hsu

(57) ABSTRACT

A light emitting diode structure has a silicon substrate, a conductive layer, and a light emitting diode. The top surface of the silicon substrate has a cup-structure like paraboloid, and the bottom of the cup-structure has a plurality of through-holes penetrating the silicon substrate. The conductive layer fills up the through-holes and protrudes out from the through-holes. The light emitting diode is disposed on the top of the conductive layer protruding out from the through-holes and is located at the focus of the cup-structure.

12 Claims, 10 Drawing Sheets

LIGHT EMITTING DIODE STRUCTURE AND MANUFACTURING METHOD THEREOF

BACKGROUND OF THE INVENTION

1. Field of the Invention

The present invention relates to a light emitting diode structure and a manufacturing method thereof, and more particularly, to a light emitting diode structure having a silicon substrate that is manufactured in a semiconductor process.

2. Description of the Prior Art

Conventional lighting industries give lamp cups a parabolic shape in order to effectively condense a light source of an incandescent lamp, and the incandescent lamp is disposed at a focal point of the lamp cup so that light scattering from the incandescent lamp can be used effectively. The surface of the lamp cup is a parabolic mirror with a micro-diffuser structure to enhance softness of the light. However, the incandescent lamps developed in recent years do not have high illumination efficiency, and generate high thermal radiation, so the light emitting diode structure having advantages of long life, small size, high illumination efficiency, low power consumption, and low contamination, etc. is gradually replacing the incandescent lamp and becoming the mainstream of new lighting sources.

As the light source changes from the conventional incandescent lamp to the light emitting diode, the difference between the light emitting diode structure and the incandescent lamp is large, so the parabolic lamp cup of the incandescent lamp cannot be reused for the light emitting diode. Please refer to FIG. 1. FIG. 1 is a schematic diagram illustrating a light emitting diode structure according to the prior art. As shown in FIG. 1, the light emitting diode structure 10 includes a light emitting diode 12, a mount lead 14, and an inner lead 16, wherein the mount lead 14 includes a flat-bottomed cup, and the light emitting diode 12 is disposed in the flat-bottomed cup of the mount lead 14. In addition, two electrodes of the light emitting diode 12 are respectively electrically coupled to the mount lead 14 and the inner lead 16 through wires 18.

In the conventional light emitting diode structure 10, the light emitted from the light emitting diode 12 can be divided into two parts: light emitted from the top of the light emitting diode, and light emitted from edges of the light emitting diode. Although the light emitted from the top of the light emitting diode can be reflected upward by the flat-bottomed cup, the flat-bottomed cup is not a good light-condensing structure, so the light will be reflected randomly and wasted. Compared with the parabolic lamp cup, the light-condensing efficiency of the flat-bottomed cup is lower. Therefore, improving the light-condensing efficiency of the light emitting diode is an important subject for the industry.

SUMMARY OF THE INVENTION

It is therefore an object of the present invention to provide a light emitting diode structure having high directionality and high thermal dissipation and a manufacturing method thereof that uses a semiconductor process.

According to an embodiment of the present invention, a light emitting diode structure is provided. The light emitting diode structure comprises a silicon substrate having a cup-structure with a parabolic shape thereon, a plurality of through-holes at the bottom of the cup-structure penetrating the silicon substrate, a reflective layer disposed on a top surface of the silicon substrate in the cup-structure, a conductive layer filling up the through-holes at the bottom of the cup-structure, and a light emitting diode. The conductive layer protrudes out from the through-holes, and a part of the conductive layer protruding out from the through holes is a base. The light emitting diode is disposed on top of the base, and the light emitting diode is located at a focus of the cup-structure.

According to an embodiment of the present invention, a method of fabricating a light emitting diode having a silicon substrate is provided. First, a silicon substrate is provided, and then, a plurality of through-holes is fabricated on a bottom surface of the silicon substrate. Next, a conductive layer is formed on the bottom surface of the silicon substrate, and the through-holes are filled up with the conductive layer to form a base. Further, a cup-structure having a parabolic shape is fabricated on a top surface of the silicon substrate, and the base is exposed to protrude out from the bottom of the cup-structure. A reflective layer is formed on the top surface of the silicon substrate in the cup-structure. Last, a light emitting diode is bonded to the base, and the light emitting diode is located at a focus of the cup-structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
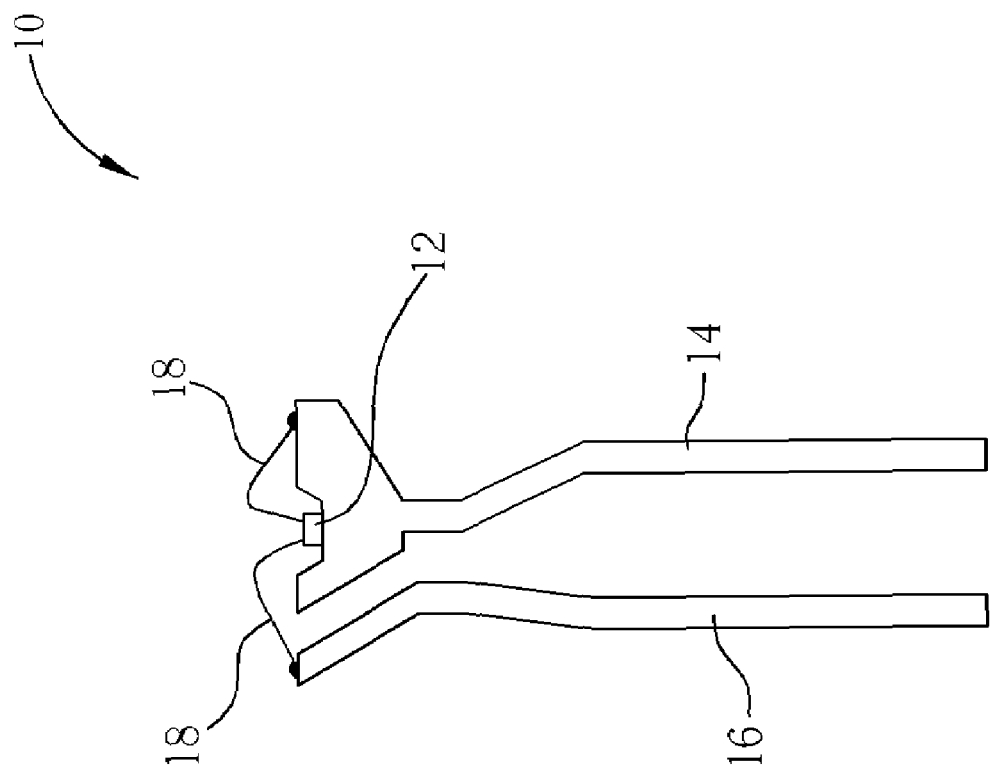
FIG. 1 is a schematic diagram illustrating a light emitting diode structure according to the prior art.
Figure 2:
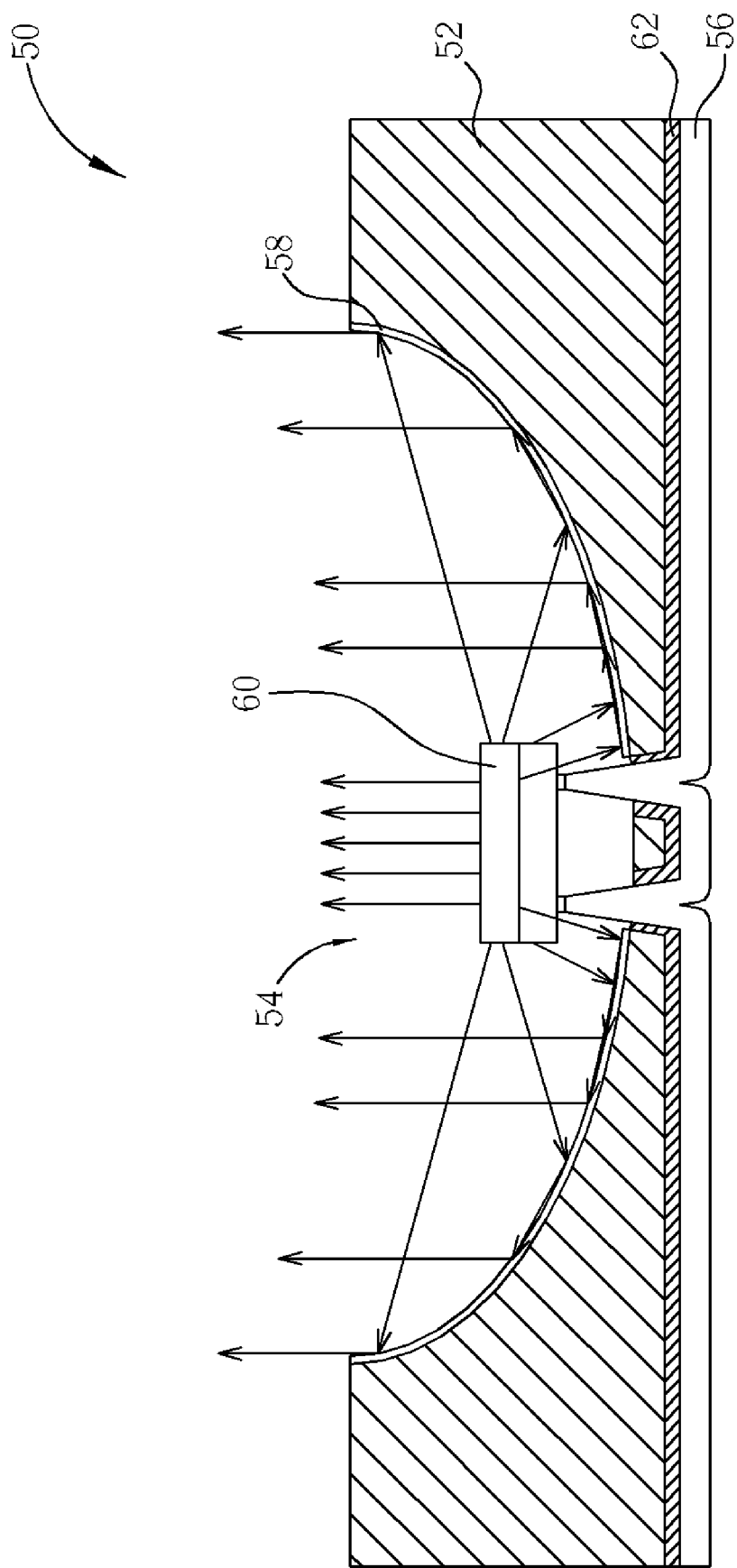
FIG. 2 is a schematic diagram illustrating a light emitting diode structure according to an embodiment of the present invention.

Please refer to FIG. 2, which is a schematic diagram illustrating a light emitting diode structure according to an embodiment of the present invention. As shown in FIG. 2, the light emitting diode structure 50 includes a silicon substrate 52, a cup-structure having a parabolic shape on a top surface of the silicon substrate 52, a plurality of through-holes at the bottom of the cup-structure 54 penetrating the silicon substrate 52, a reflective layer 58 disposed on the top surface of the silicon substrate 52 in the cup-structure 54, a conductive layer 56 filling the through-holes at the bottom of the cup-structure 54 and protruding out from the through-holes, and a light emitting diode 60. A part of the conductive layer 56 protruding out from the through-holes is a base. The light emitting diode 60 is disposed on the top of the base and located at a focus of the cup-structure 54. In addition, the light emitting diode structure 50 further includes a dielectric layer 62 disposed between the silicon substrate 52 and the conductive layer 56, and the dielectric layer 62 is composed of silicon oxide, silicon nitride or silicon oxy-nitride and can serve as an etching stop layer in a manufacturing process.

The material of the silicon substrate 52 includes polycrystalline silicon, amorphous silicon, or monocrystalline silicon, and the silicon substrate 52 can be a rectangular silicon chip or a circular silicon chip. The silicon substrate 52 can also include completed integrated circuits or passive devices. In addition, because silicon has good thermal conductivity, the thermal dissipation effect of the light emitting diode structure can be increased. Also, the thermal expansion factor of silicon is similar to the factor of the material of the light emitting diode, so that the reliability of the light emitting diode structure also can be increased.

The reflective layer 58 comprises materials having high reflectivity, such as metal or optical films, and the reflective layer 58 has a parabolic shape used to reflect light emitted from side surfaces of the light emitting diode 60 upward (indicated by arrows shown in FIG. 2). In addition, the reflective layer 58 and the conductive layer 56 are electrically decoupled. The conductive layer 56 is composed of metal, and the conductive layer 56 can be a piece of a metal layer or a circuit layer having circuits therein. The conductive layer 56 is used to electrically couple the light emitting diode 60 to external circuits, so that the light emitting diode 60 can be driven.

Figure 3:
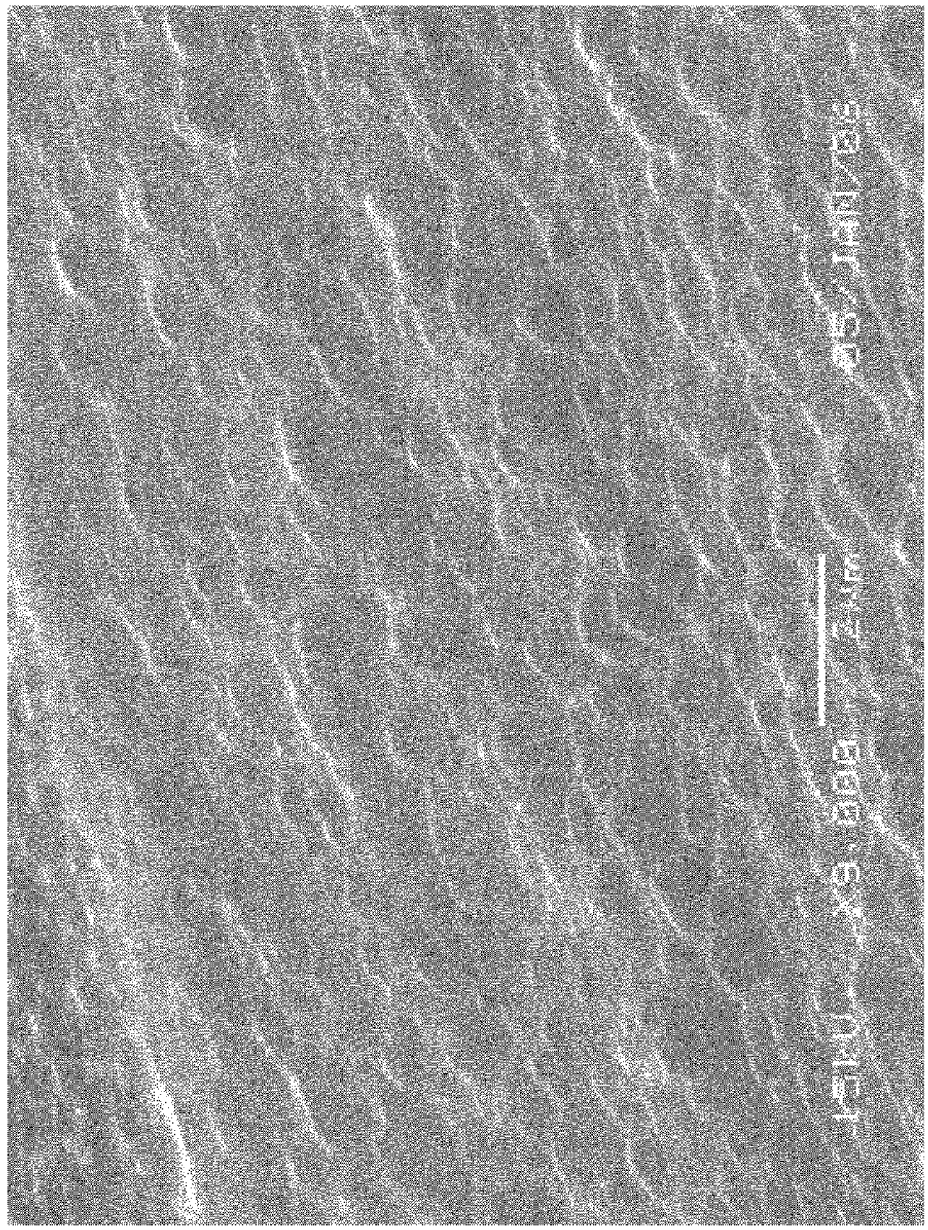
FIG. 3 is a microphotograph showing a micro-diffuser structure on a top surface of the silicon substrate in the cup-structure.

It should be noted that the surface of the cup-structure 54 could further have a micro-diffuser structure thereon, as shown in FIG. 3. FIG. 3 is a microphotograph showing a micro-diffuser structure on the top surface of the silicon substrate 52 in the cup-structure 54. The micro-diffuser structure on the top surface of the silicon substrate in the cup-structure 54 makes the reflective layer 58 on the cup-structure 54 also have the micro-diffuser structure. The micro-diffuser structure diffuses the light emitted from the light emitting diode 60 during reflection by the reflective layer 58, so that the glare produced by smooth surfaces can be avoided. In this embodiment, an undulate difference of the micro-diffuser structure is substantially 1 μm, so that the diffusion of the light from the reflective layer 58 can be obvious.

In addition, because the through-holes at the bottom of the cup-structure 54 penetrate the silicon substrate 52, the conductive layer 56 can extend from the bottom surface to the top surface of the silicon substrate 52 through the through-holes. Although the bottom surface of the silicon substrate 54 is not flat, the light emitting diode 60 can still be directly disposed on the top of the base in the cup-structure 54 and electrically coupled to the conductive layer 56. No wire bonding process is required, so the manufacturing cost in the process can be saved. Furthermore, because the base of the conductive layer 56 protrudes out from the through-holes, the light emitting diode 60 can be distanced from the surface of the silicon substrate 52 in the cup-structure 54 so that the light emitting diode 60 can be disposed at the focus of the cup-structure 54. The light emitted from the side surfaces of the light emitting diode 60 can be condensed and reflected upward by the reflective layer 58 having a parabolic shape, similar to a light source disposed at a focus of a parabolic mirror, to have a directional condensing effect.

Therefore, the light emitting diode structure of the present invention lets the light emitted from the light emitting diode reflect upward and be condensed, and the present invention uses the micro-diffuser structure of the cup-structure to diffuse the light in order to prevent the glare.

Figure 4:
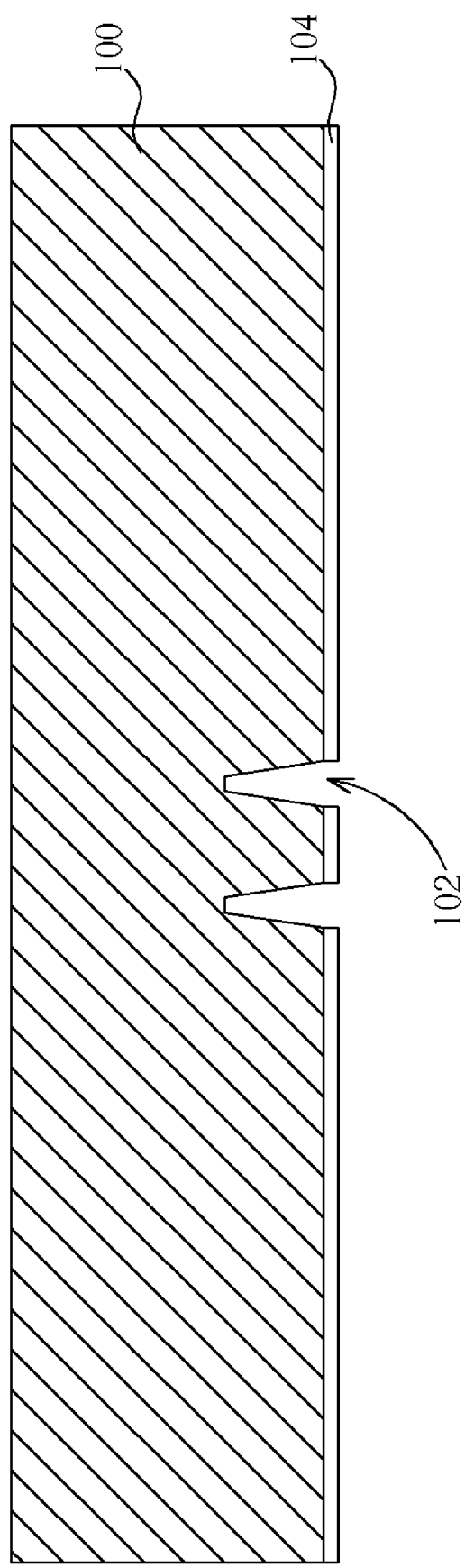
FIG. 4 to FIG. 10 are schematic diagrams illustrating a method of fabricating a light emitting diode structure according an embodiment of the present invention.

Please refer to FIG. 4 to FIG. 10, which are schematic diagrams illustrating a method of fabricating a light emitting diode structure according an embodiment of the present invention. As shown in FIG. 4, a silicon substrate 100 is provided. Then, a mask 104 with patterns is fabricated on the bottom surface of the silicon substrate 100 by a lithographic process, and a plurality of through-holes with high aspect ratio having an inclined sidewall is fabricated at the bottom of the silicon substrate 100 by an etching process. The etching process utilized for fabricating the through-holes 102 with the high aspect ratio can be a reactive ion etching (RIE) process, a Bosch process, or a wet etching process using potassium hydroxide (KOH), tetramethylammonium hydroxide (TMAH), or ethylenediamine-pyrocatechol-water (EDP) as an etching solution. The Bosch process, also known as pulsed or time-multiplexed etching, alternates repeatedly between standard isotropic plasma etch and deposition of a chemically inert passivation layer to achieve nearly vertical structures.

Figure 5:
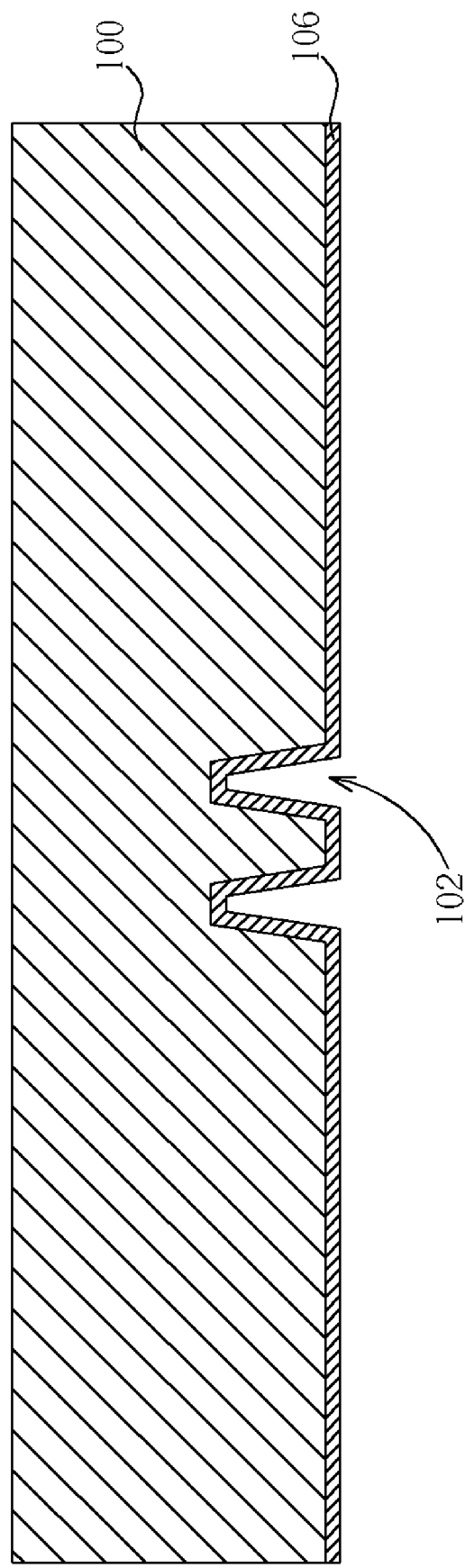

As shown in FIG. 5, the mask 104 is removed, and then an etching stop layer 106 is formed in the through-holes 102. The etching stop layer 106 is composed of dielectric materials, such as silicon oxide, silicon nitride, or silicon oxynitride, and a method of forming the etching stop layer 106 includes atmospheric pressure chemical vapor deposition, low pressure chemical vapor deposition, plasma enhanced chemical vapor deposition, or high density plasma chemical vapor deposition.

Figure 6:
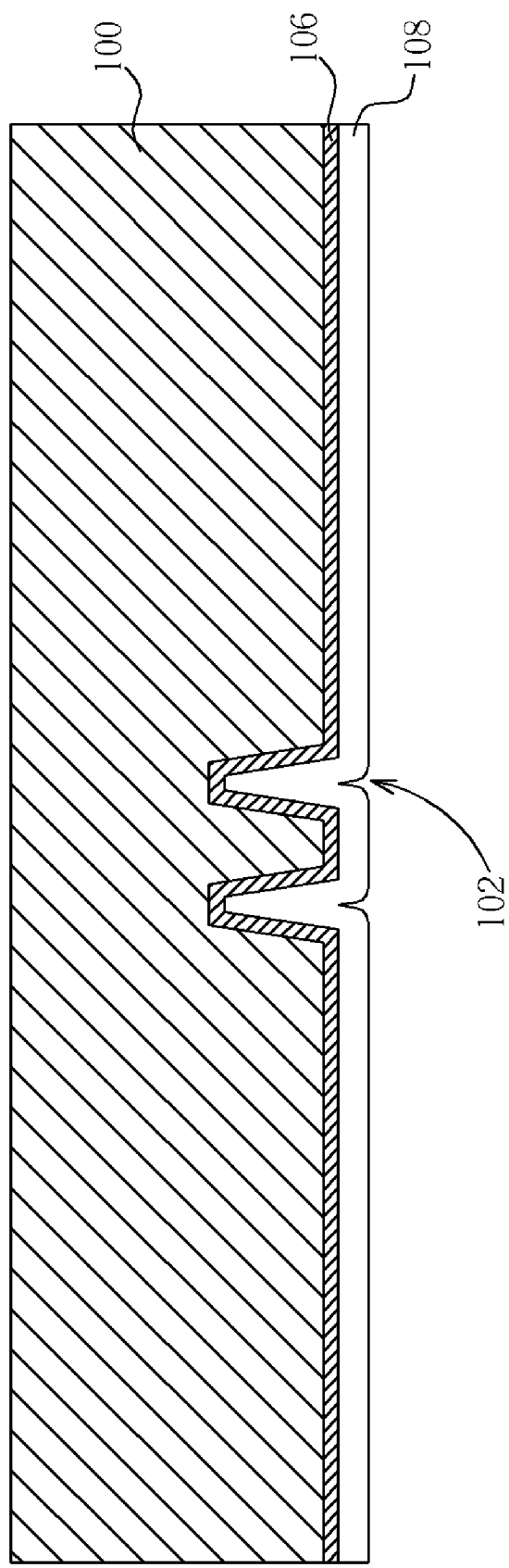

As shown in FIG. 6, a conductive layer 108 is formed on the etching stop layer 106, and the through-holes 102 are filled with the conductive layer as a base. The conductive layer 108 comprises metal, and a method of fabricating the conductive layer 108 can be sputtering, chemical vapor deposition, or evaporation.

Figure 7:
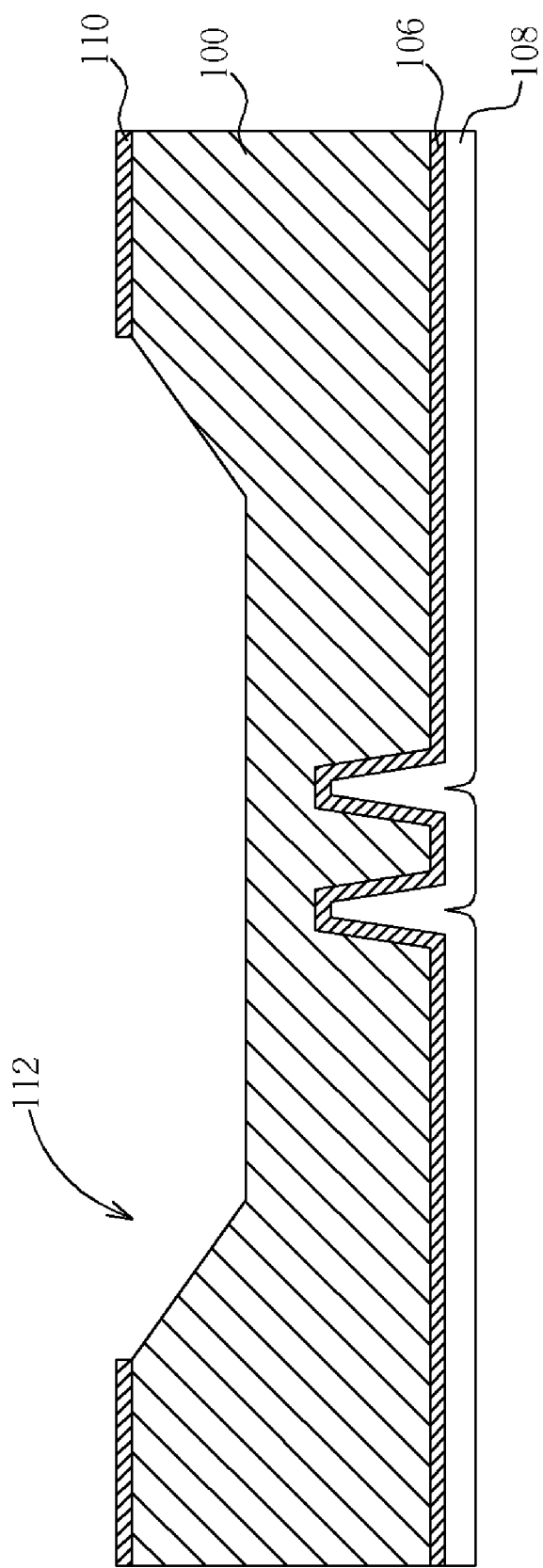

As shown in FIG. 7, a mask 110 with patterns is fabricated on the top surface of the silicon substrate 100 by a lithographic process, and then a cup-structure 112 having inclined sidewalls is fabricated on the top surface of the silicon substrate 100 by a wet etching process. The wet etching process uses KOH, TMAH, or EDP as an etching solution.

Figure 8:
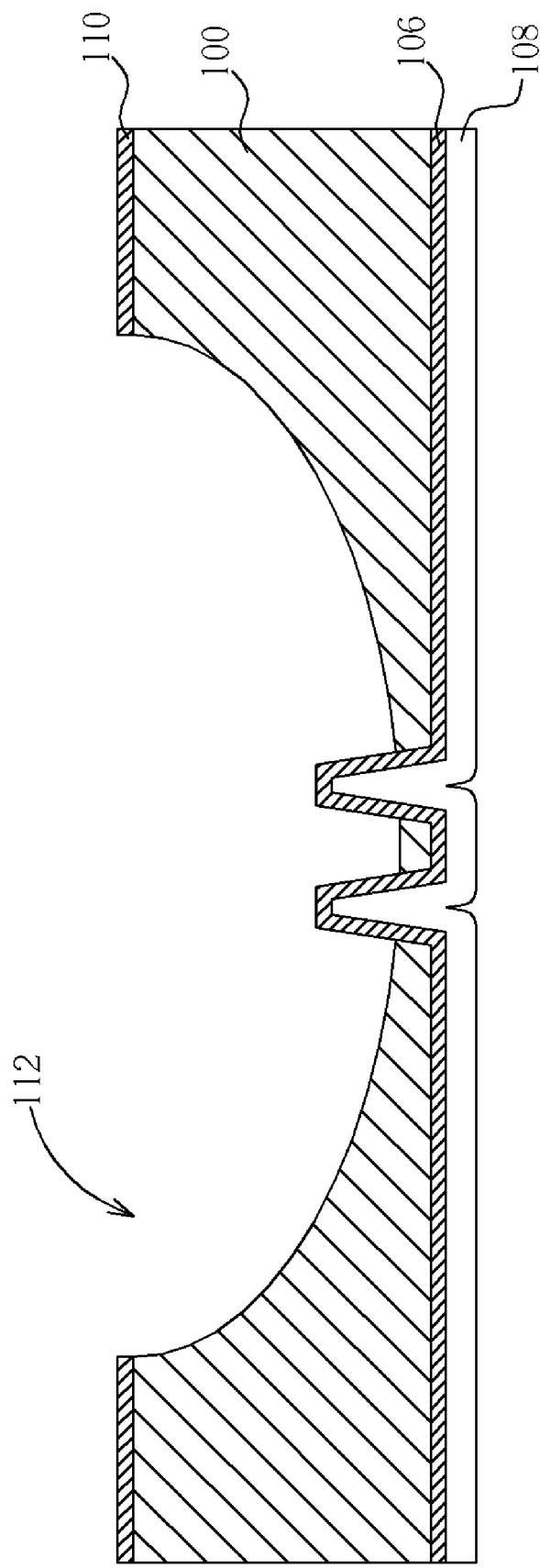

As shown in FIG. 8, next a parabolic shape of the cup structure 112 is formed by a dry etching process, and the etching stop layer 106 on the top of the base is exposed. Then, a micro-diffuser structure (indicated by the micro-diffuser structure shown in FIG. 3) is fabricated on the surface of the cup-structure 112. The dry etching process includes a reactive ion etching process or a Bosch process. The Bosch process, also known as pulsed or time-multiplexed etching, alternates repeatedly between standard isotropic plasma etch and deposition of a chemically inert passivation layer to achieve nearly vertical structures. It should be noted that the etching stop layer 106 is used to prevent the conductive layer 108 from being etched in the dry etching process. The depth of the base can be controlled accurately, so the light emitting diode disposed on the base can be accurately located at the focus of the cup-structure 112.

Figure 9:
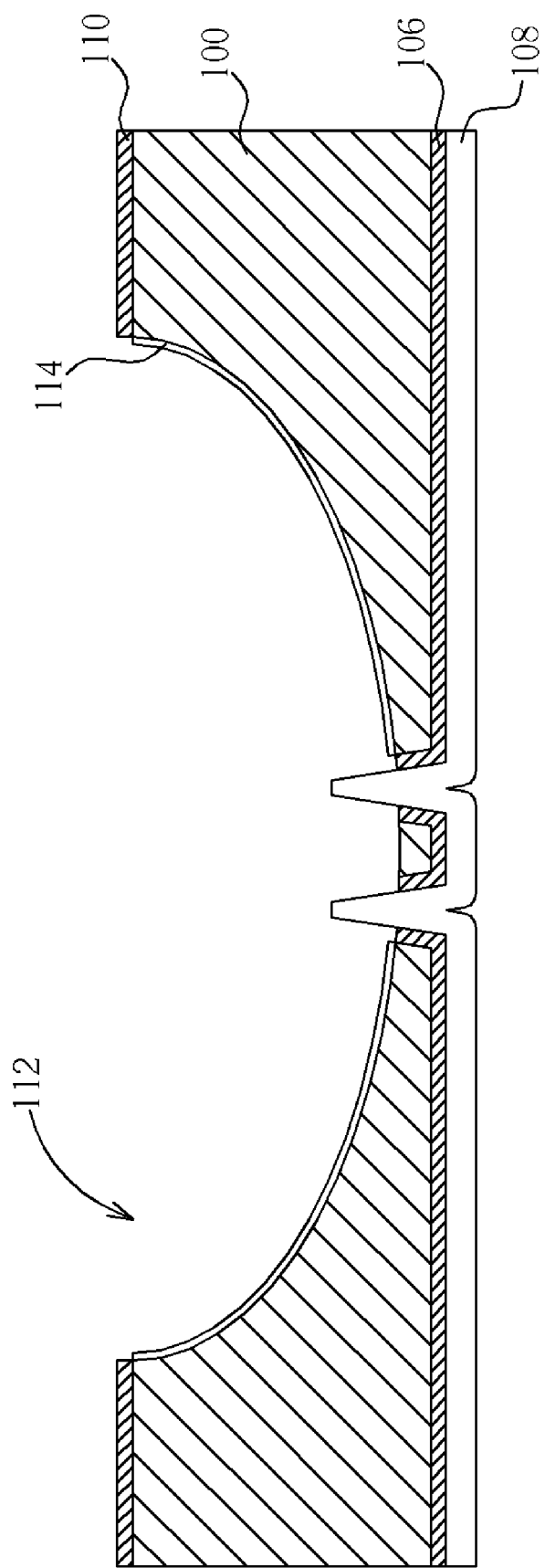

As shown in FIG. 9, the etching stop layer is etched by a dry or wet etching process to expose the base, and then a reflective layer 114 is formed on the top surface of the cup-structure 112. The reflective layer 114 is a film, such as a metal or optical film, which is formed on the cup-structure 112 by sputtering, chemical vapor deposition, or evaporation.

Figure 10:
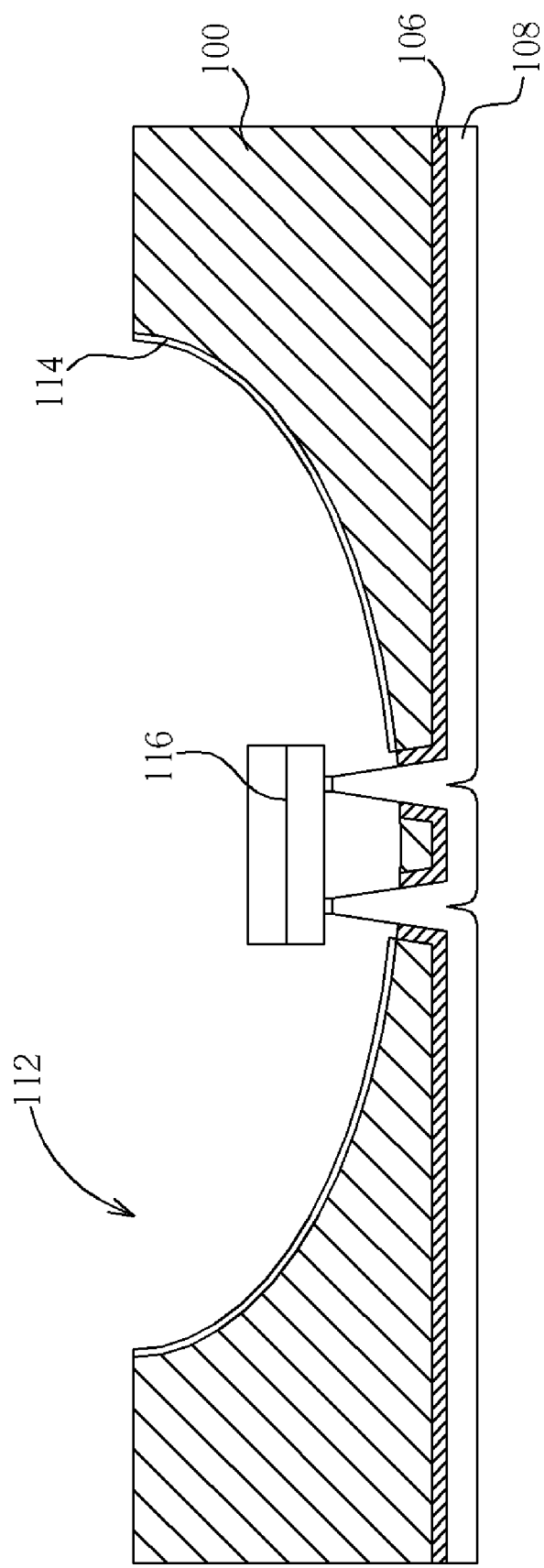

As shown in FIG. 10, the mask 110 is removed, and a die-attachment process, such as a flip-chip process or a die attachment using glass frit, is performed to bond a light emitting diode 116 to the base. The light emitting diode 116 is located at the focus of the cup-structure 112, and the light emitting diode structure of the present invention is thus completed.

In summary, the present invention uses lithographic and etching processes to fabricate a parabolic-shaped cup-structure on the silicon substrate, and also fabricates a base in the cup-structure to hold the light emitting diode, so that the light emitting diode can be disposed at the focus of the cup-structure. Therefore, the problem of not being able to dispose the light emitting diode on a curved cup-structure can be solved. In addition, the present invention provides a micro-diffuser structure formed by the etching process to prevent glare. The light emitting diode structure of the present invention further provides the parabolic-shaped cup-structure to condense the light emitted from the sidewalls of the light emitting diode efficiently, so as to have a directional function.

Those skilled in the art will readily observe that numerous modifications and alterations of the device and method may be made while retaining the teachings of the invention.

What is claimed is:

1. A method of fabricating a light emitting diode comprising:
   providing a silicon substrate;
   fabricating a plurality of through-holes on a bottom surface of the silicon substrate;
   forming a conductive layer on the bottom surface of the silicon substrate, and filling the through-holes with the conductive layer to form a base;
   fabricating a cup-structure having a parabolic shape on a top surface of the silicon substrate, and exposing the base to protrude out from a bottom of the cup-structure;
   forming a reflective layer on the top surface of the silicon substrate in the cup-structure; and
   bonding a light emitting diode on the base at a focus of the cup-structure.

2. The method of claim 1, further comprising forming an etching stop layer in the through-holes before forming the conductive layer.

3. The method of claim 2, wherein the etching stop layer is an oxide layer, a nitride layer or an oxy-nitride layer.

4. The method of claim 2, wherein the etching stop layer is formed by atmospheric pressure chemical vapor deposition, lower pressure chemical vapor deposition, plasma enhanced chemical vapor deposition, or high density plasma chemical vapor deposition.

5. The method of claim 2, wherein the step of forming the cup-structure having the parabolic shape comprises:
   using a wet etching process to fabricate a cup-structure having inclined sidewalls;
   using a dry etching process to etch the cup-structure to form the parabolic shape, and exposing the etching stop layer on the base; and
   etching the etching stop layer until the base is exposed.

6. The method of claim 5, wherein the wet etching process uses KOH, TMAH or EDP as an etching solution.

7. The method of claim 5, wherein the dry etching process comprises a reactive ion etching process or a Bosch process.

8. The method of claim 1, further comprising fabricating a micro-diffuser structure on the top surface of the silicon substrate in the cup-structure after forming the cup-structure.

9. The method of claim 8, wherein the micro-diffuser structure is formed by a dry etching process.

10. The method of claim 9, wherein the dry etching process comprises a reactive ion etching process or a Bosch process.

11. The method of claim 1, wherein the conductive layer is metal.

12. The method of claim 1, wherein the through-holes are formed by an etching process, and the etching process comprises a reactive ion etching process, a Bosch process, or a wet etching process using KOH, TMAH or EDP as an etching solution.

* * * * *